United States Patent [19]

Heitjohann et al.

[11] Patent Number: 5,057,799
[45] Date of Patent: Oct. 15, 1991

[54] DAMPING DEVICE

[75] Inventors: Frank Heitjohann, Weissenhorn; Bernhard Wagner, Senden; Alfred Koreis, Erbach, all of Fed. Rep. of Germany

[73] Assignee: Telefunken Systemtechnik GmbH, Ulm, Fed. Rep. of Germany

[21] Appl. No.: 547,289

[22] Filed: Jul. 3, 1990

[30] Foreign Application Priority Data

Jul. 4, 1989 [DE] Fed. Rep. of Germany ....... 3921908

[51] Int. Cl.$^5$ .............................................. H03H 7/24
[52] U.S. Cl. .................................. 333/81 R; 307/264
[58] Field of Search ............. 333/81 R; 307/261, 264, 307/498, 529, 555

[56] References Cited

U.S. PATENT DOCUMENTS

| 3,789,309 | 1/1974 | Embley | 307/555 X |
| 4,300,108 | 11/1981 | Shuck et al. | 333/81 R |
| 4,494,084 | 1/1985 | Hughes | 333/81 R |
| 4,623,799 | 11/1986 | Nyman, Jr. | 307/261 X |

Primary Examiner—Paul Gensler
Attorney, Agent, or Firm—McGlew & Tuttle

[57] ABSTRACT

A damping device for HF signals with an analog-energizable attenuator, for drift-free generation of the analog control signal, in which any damping characteristics and corrections that may be necessary can be taken into account in a simple manner and individually for each damping device using EPROM components.

8 Claims, 2 Drawing Sheets ns. 5,057,799

DAMPING DEVICE

FIELD OF THE INVENTION

The present invention pertains to a damping device for HF signals with an attenuator that can be energized in an analog manner and a control signal generator to generate an analog control signal for the attenuator.

BACKGROUND OF THE INVENTION

In most cases, diode devices, whose conducting-state resistance changes with the value of an applied analog control voltage, are used as attenuators for HF signals. The function of the damping change differs and is closely linked with the amplitude applied, the temperature, the circuit design, and ultimately with the type of the diodes. Calibration in decibels can be achieved by inserting an amplifier with a logarithmic characteristic. An analog control signal for the attenuator is generated in a control signal generator from an input signal that represents the desired damping.

The setting of the control signal generator according to the existing damping characteristics and the temperature dependences of components of the control signal generator, which adjustment must be performed individually for every single damping device, has proved to be especially problematic. This problem is particularly, acute when the damping is to be set according to input signals present in different forms (analog/digital).

SUMMARY AND OBJECTS OF THE INVENTION

It is an object of the present invention to provide a damping device of the type described in the introduction which permits simple and stable setting of the control signal generator for practically any damping characteristic and dependence of the damping process on various input signals.

According to the present invention a damping device for high frequency (HF) signals with an analog-energizable attenuator and a control signal generator for generating an analog control signal for the attenuator comprises a control signal generator first input for a first digital input signal and a control signal generator second input for a second analog input signal. Conversion means is provided for driving a first analog input from the first digital input signal. Analog summing means is provided for reforming an analog aggregate signal from the first and second input signal. Assignment means is provided for generating an analog control signal as a function of the analog aggregate signal.

According to a further aspect of the invention, a damping device for high frequency (HF) signals with an analog-energizable attenuator and a control signal generator for generating an analog control signal is provided comprising a control signal generator first input for a first digital input signal and a control signal generator second input for a second analog input signal. An analog digital converter is provided for digitizing the second analog input signal A digital read-only memory is provided which is addressed by the first digital input signal and the digitized second input signal, the digital read-only memory sends a digital control signal. And a digital analog converter for transforming the digital control signal into an analog control signal.

The present invention uses components with temperature-independent properties in a pilot frequency generator and transforms the input signals before they are combined into identical signal types with the same dependence of damping on the signal amplitude.

The temperature dependence of the damping properties, which is inherent in the attenuator itself, is counteracted by stabilizing the temperature of the attenuator. The attenuator is preferably stabilized at a temperature above ambient, so that a single but accurately operating heating element can be used for temperature control.

By using EPROMS (erasable programmble read-only memories), it is possible to take into account any damping characteristics and dependences (e.g., dB calibration) individually and in a simple manner. Accumulated errors which arise from the series connection of components ca also be detected and compensated for by the EPROMS. The determination of the memory contents to be programmed in the EPROMS as assignments of digital output values to digital address values is advantageously performed by a computer-controlled measurement, which permits a great number of discrete support values to be determined within a short time. The programming of the EPROM read-only memories can also be controlled directly via the computer.

The various features of novelty which characterize the invention are pointed out with particularity in the claims annexed to and forming a part of this disclosure. For a better understanding of the invention, its operating advantages and specific objects obtained by its uses, reference is made to the accompanying drawings and descriptive matter in which a preferred embodiment of the invention is illustrated.

DETAILED DESCRIPTION OF THE PREFERRED EMBODIMENT

Figure 1:
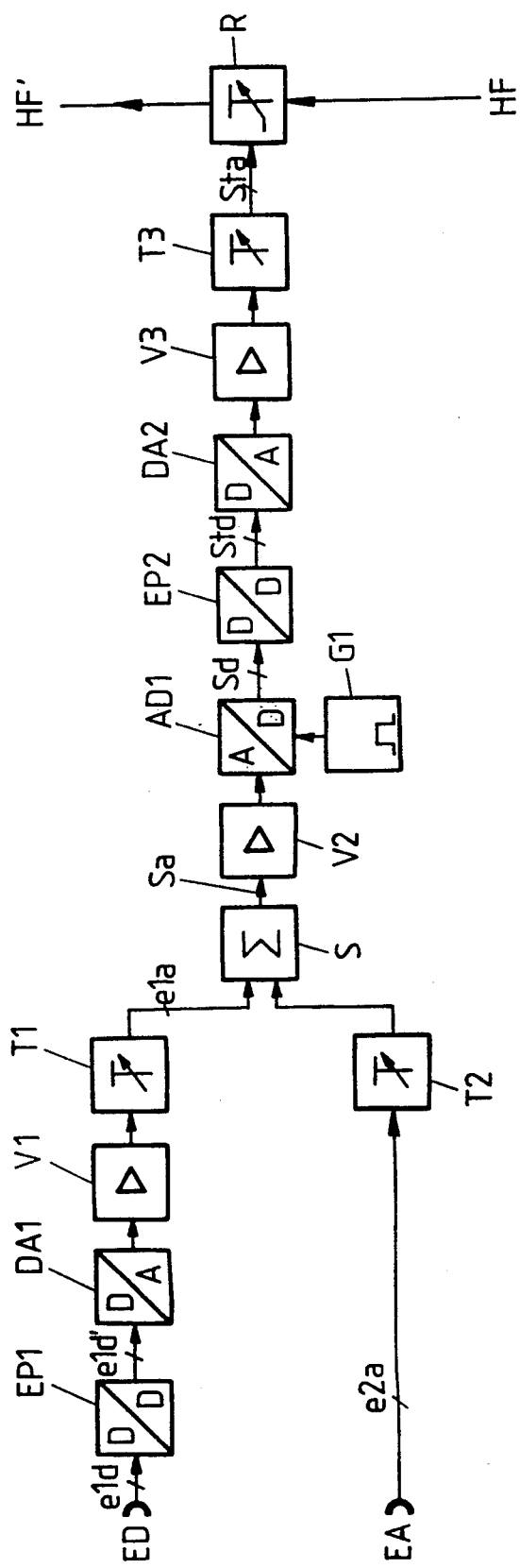
FIG. 1 is a schematic representation of a frequency generator according to a first embodiment of the invention; and, FIG. 2 is a schematic representation of a second embodiment according to the invention.

Referring to the drawings and in particular to FIG. 1, FIG. 1 shows the device according to the invention including a preferred design of a pilot frequency generator with a first input ED for a first, digital, input signal eld and a second input EA for a second, analog, input signal e2a to generate an analog control signal Sta for an attenuator R, which is connected into the path of a high-frequency signal HF. The signal damping curve in the attenuator R should be a logarithmic function of the sum of the input signals. The first digital input signal eld addresses a first EPROM read-only memory EP1, which sends a corrected digital input signal eld'. This corrected digital input signal eld' is transformed into an analog signal in the subsequent digital/analog converter DA1 and after passing through the amplifier V1 and the voltage divider T1, set to a fixed value, this analog signal is applied as a first analog input signal to one of two inputs of a summing element S. Via a second voltage divider T2, the second analog input signal e2a is sent to the other input of the summing element S. The analog aggregate signal Sa at the output of the summing element S passes through the amplifier V2 and is digitized in the analog/digital converter AD1, which is energized by a modulating signal generator G1. The digitized aggregate signal Sd addresses a second EPROM read-only memory EP2, which sends a digital control signal Std according to its stored assignment instruction. The digital control signal Std is present at the input of a second digital/analog converter, which sends, via a third amplifier V3 and a third voltage divider T3, an analog control signal Sta, which is applied to the control input of the attenuator R. The amplifiers V1 and V3 invert the signal and serve essentially as matching elements. All the amplifiers can be designed as sufficiently drift-free amplifiers. The voltage dividers T1, T2, and T3, which also serve as matching elements, have fixed settings and also show no drift of the division ratio. Corrections for the signal path, through which only the first control signal flows, can be taken into account in EPROM EP1, and the resolution can be refined by a greater digital word length.

Both corrections made necessary by components in the rest of the signal path and the damping characteristic of the attenuator and the underlying damping curve (e.g., logarithmic) are stored in the EPROM read-only memory EP2 as a function of the input signal as assignment of a digital control signal Std to a digital aggregate signal Sd.

By taking into account separately the corrections for the signal path in the first EPROM EP1, through which only the first input signal flows, the determination of the EPROM memory values is particularly simple and transparent.

Figure 2:
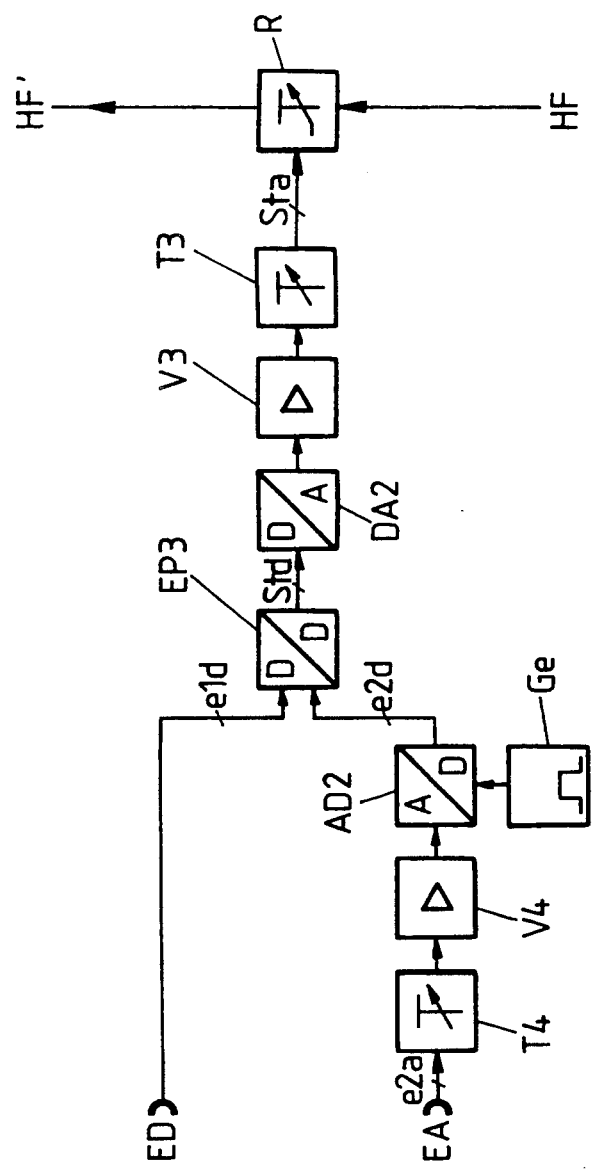

The arrangement according to FIG. 2 differs from the above-described one essentially in that one passes over early to fully digital signal processes by sending the first digital input signal e1d directly as a first partial address, and the second analog input signal e2a after amplification at amplifier V4 and transformation in an A/D converter AD2 (with modulating signal generator G2) into a second digital input signal e2d as a second partial address, to the address inputs of the EPROM read-only memory EP3, which sends, as is described in FIG. 1, a digital control signal Std. In this case, all the necessary corrections as well as the damping characteristic and the damping curve which is, e.g., logarithmic, are taken into account in EPROM EP3. This makes the circuit design particularly simple, but the determination of the memory values for the EPROM becomes much more complex.

The present invention also makes it possible to compensate for changes caused by aging in the damping characteristic of the attenuator or in other analog components in a simple manner, namely, by repeatedly measuring and reprogramming affected EPROM read-only memories.

The various features of novelty which characterize the invention are pointed out with particularity in the claims annexed to and forming a part of this disclosure. For a better understanding of the invention, its operating advantages and specific objects obtained by its uses, reference is made to the accompanying drawings and descriptive matter in which a preferred embodiment of the invention is illustrated.

What is claimed is:

1. A damping device for high frequency signals including an analog-energizable attenuator and a control signal generator for generating an analog control signal for the attenuator, the control signal generator comprising:

a control signal generator first input, for a first, digital, input signal; a control signal generator second input for a second, analog, input signal; digital to analog conversion means for deriving a first, analog, input signal from said first, digital, input signal; analog summing means for forming an analog aggregate signal from the first and second, analog, input signals; and assignment means for deriving the analog control signal as a function of said analog aggregate signal.

2. A device according to claim 1, wherein said assignment means comprises, connected in series, an analog-digital converter for digitizing the aggregate signal a digital read-only memory, which is addressed by the digitized aggregate signal and sends a digital control signal; and a digital-analog converter for transforming a digital control signal into the analog control signal.

3. A device according to claim 2, wherein said digital read-only memory is an EPROM component.

4. A device according to claim 1, wherein said digital to analog conversion means includes a read-only memory addressed by said first digital input signal and a digital-analog converter following said read-only memory.

5. A damping device for high frequency signals including an analog-energizable attenuator and a control signal generator for generating an analog control signal for the attenuator, the control signal generator comprising:

a control signal generator first input for a first, digital, input signal; a control signal generator second input for a second, analog, input signal; analog-digital conversion means for digitizing said second, analog, input signal; a digital read-only memory, which is addressed by said first, digital, input signal and said digitized second input signal, and sends a digital control signal; and, digital-analog conversion means for transforming said digital control signal into the analog control signal.

6. A device according to claim 5, wherein said digital read-only memory is an EPROM component.

7. A device according to claim 5, wherein the attenuator is stabilized at a temperature.

8. A device according to claim 7 wherein said attenuator is stabilized at a temperature above ambient temperature and a heating element is provided for controlling the temperature of the attenuator.

* * * * *